(12) United States Patent
Högerl

(10) Patent No.: US 6,737,581 B2
(45) Date of Patent: May 18, 2004

(54) CONFIGURATION OF A PLURALITY OF CIRCUIT MODULES

(75) Inventor: Jürgen Högerl, Regensburg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/858,421

(22) Filed: May 16, 2001

(65) Prior Publication Data

US 2002/0050376 A1 May 2, 2002

(30) Foreign Application Priority Data

May 16, 2000 (DE) .......................................... 100 23 869

(51) Int. Cl.[7] .............................................. H01L 23/02
(52) U.S. Cl. ...................... 174/52.4; 257/686; 257/675; 257/676; 257/692; 257/738; 257/713
(58) Field of Search ................................. 174/52.2, 52.4; 257/686, 685, 675, 676, 692, 738, 713

(56) References Cited

U.S. PATENT DOCUMENTS 4,996,587 A * 2/1991 Hinrichsmeyer et al. ... 257/676

5,016,138 A     5/1991   Woodman ................... 361/688
5,036,431 A     7/1991   Adachi et al.
6,020,629 A  *  2/2000   Farnworth et al. .......... 257/686

FOREIGN PATENT DOCUMENTS

DE    2 008 496         9/1971
DE    73 28 667         11/1977
DE    245 099 A1        4/1987
DE    197 58 197 A1     7/1999

* cited by examiner

Primary Examiner—Hung V. Ngo
(74) Attorney, Agent, or Firm—Laurence A. Greenberg; Werner H. Stemer; Gregory L. Mayback

(57) ABSTRACT

A circuit configuration for reliably and simply interconnecting circuit modules includes a connection carrier and circuit modules disposed essentially one above another approximately in a stack. Each of the circuit modules has a connecting device for externally and electrically bonding the circuit modules. The connecting device has at least one series configuration of connecting elements disposed essentially in a plane. The connecting elements are disposed on the connection carrier. The connecting device of at least one of the circuit modules is at least partially electrically connected to another connecting device of at least one different one of the circuit modules in direct mechanical and electrical contact.

46 Claims, 5 Drawing Sheets

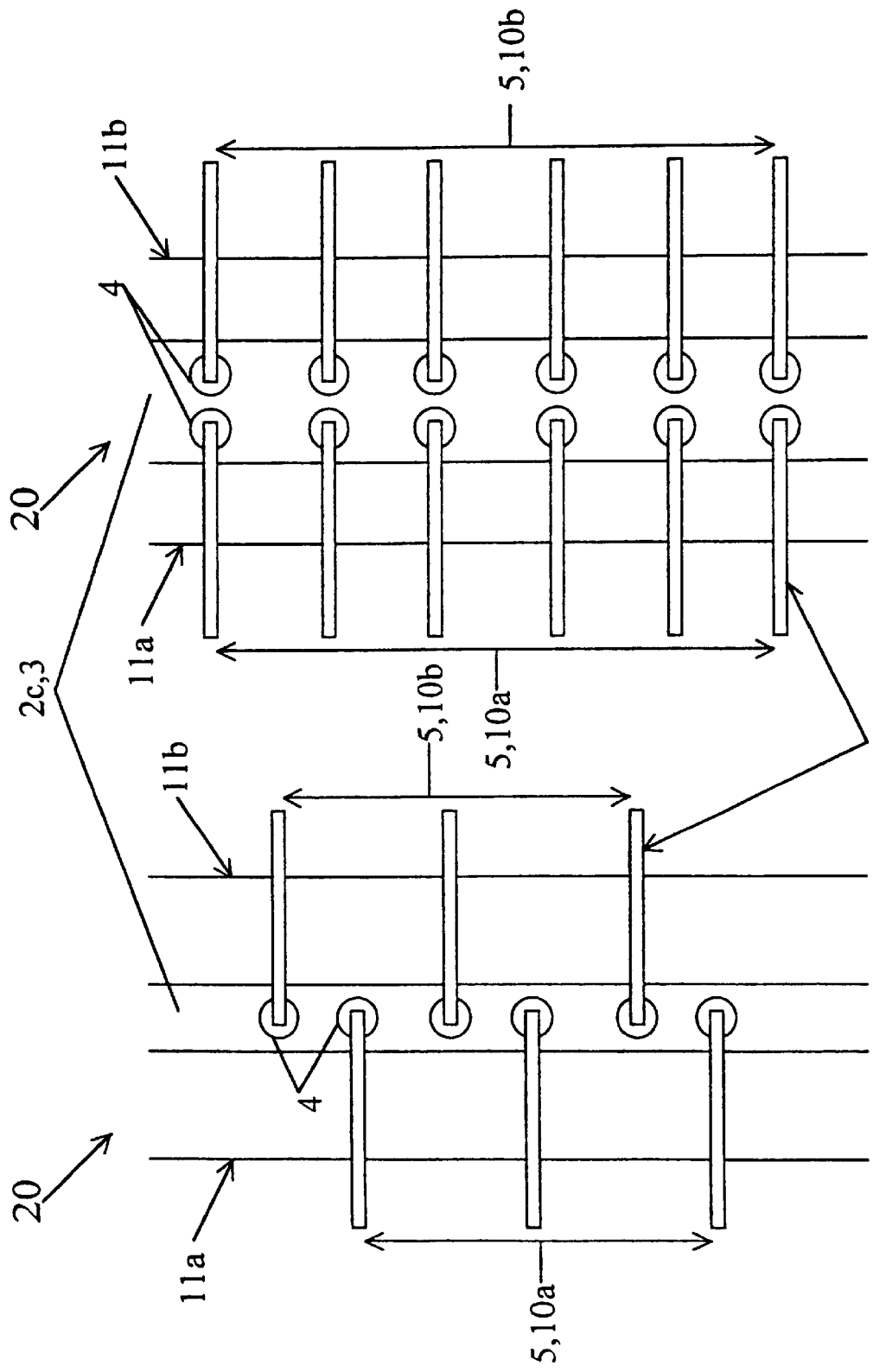

CONFIGURATION OF A PLURALITY OF CIRCUIT MODULES

BACKGROUND OF THE INVENTION

1. Field of the Invention

The invention relates to a configuration of a plurality of circuit modules disposed essentially one above the other approximately in the form of a stack. A respective connecting device is provided for the external electrical bonding of the circuit modules. An electrical connection is at least partially provided between the connecting devices of the circuit modules, and an electrical connection of various connecting devices among one another is respectively formed by essentially direct mechanical and electrical contact of various connecting devices.

In circuit engineering, and, in particular, in semiconductor electronics, it has for some time been endeavored to construct circuit configurations that realize as high a number of components and/or circuit functions as possible in the smallest space. It is accordingly endeavored to keep reducing the size of the corresponding components and circuit functions within the bounds of physical possibilities. Because, in the endeavor, it is not possible to go below certain physical limits, it must be expected that, for each electronic component, there will be a minimum size, based on physical principles, but, under certain circumstances, the minimum size can only be realized in mass production with considerable expenditure in terms of cost.

Ways around the dilemma, ensuring the highest possible utilization of the surface area by corresponding wiring, have accordingly been sought. For instance, it has been proposed, in particular, in the case of semiconductor modules, to dispose chips, or quite generally in the case of circuit modules, to position a plurality of the necessary circuit modules such that they are disposed in layers one above the other in the vertical direction. The stacking, as it is known, of a plurality of circuit modules consequently departs from the two-dimensional plane and package and makes it possible to utilize the third dimension, in the vertical direction, by corresponding packing of a plurality of circuit modules one above the other.

It is often necessary for the circuit modules disposed one above the other to be interconnected. Thus, the connecting devices necessary in each case for the external electrical bonding of the respective circuit modules must also be at least partially electrically and electronically connected to one another by a plurality of connecting elements, i.e., the initially electrically isolated circuit modules must be interconnected by connecting devices that have to be provided. Various concepts for the interconnection have been proposed to interconnect the connecting devices of the respective circuit modules.

The prior art includes, for example, a positioning of circuit modules of various sizes one above the other so that a frustopyramidal structure of circuit modules decreasing in their base area in the vertical direction from the bottom upward is produced and is then disposed as a stack on a corresponding carrier. For interconnection, corresponding wire bonds are then individually led down from each circuit module onto the surface of the common carrier, where the actual electrical bonding with the outside and among the modules is then realized on a corresponding conductive substrate. One disadvantage of such a procedure is that circuit modules of different sizes, i.e., base areas, have to be configured, resulting in a problematical combination of identical modules. Another disadvantage is that respective individual wire bonds have to be formed and pulled, which, although it does not preclude automation of the bonding, makes such an automatic process difficult.

If, on the other hand, circuit modules of an identical size are stacked one above the other, the interconnection of the circuit modules lying at the top by corresponding wire bonds is necessary even if the circuit module disposed at the very bottom can be attached and bonded on the common carrier, for example, by flip-chip technology.

To circumvent such problems, other procedures have also been proposed. For example, U.S. Pat. No. 5,016,138 to Woodman discloses a configuration of a plurality of circuit modules in which the circuit modules are disposed essentially one above the other, for instance, in a stack. For the external bonding of the circuit modules, in each case a connecting device with a plurality of connecting elements is provided. In the prior art according to U.S. Pat. No. 5,016,138, the connecting device is realized by respectively disposing the individual chips on a separate carrier, on which the contacts of the chips are then led out through a printed-on circuit configuration to the margin of the carrier, to corresponding contact pins that are disposed in the edge region of the carrier. The respective entireties of contact pins are then electrically bonded and interconnected by a plurality of bonding and interconnecting plates reaching laterally around the stack.

A disadvantage of such a procedure is that each circuit module must, in turn, be placed on a carrier and that the interconnection of the various carriers necessitates the assembly of a multiplicity of individual components because an inherent interconnection of modules is not possible here on account of their natural construction.

SUMMARY OF THE INVENTION

It is accordingly an object of the invention to provide a configuration of a plurality of circuit modules that overcomes the hereinafore-mentioned disadvantages of the heretofore-known devices of this general type and that interconnects the circuit modules disposed one above the other in a particularly reliable and, nevertheless, simple and low-cost way.

With the foregoing and other objects in view, there is provided, in accordance with the invention, a circuit configuration, including a connection carrier, circuit modules disposed essentially one above another approximately in a stack, each of the circuit modules having a connecting device for externally and electrically bonding the circuit modules, the connecting device having at least one series configuration of connecting elements disposed essentially in a plane, the connecting elements disposed on the connection carrier, and the connecting device of at least one of the circuit modules at least partially electrically connected to another connecting device of at least one different one of the circuit modules in direct mechanical and electrical contact.

In the congeneric configuration of a plurality of circuit modules, the circuit modules are disposed essentially one above the other approximately in the form of a stack. For the external electrical bonding of the circuit modules, in each case a connecting device with a plurality of connecting elements is provided. An electrical connection is at least partially provided between the connecting devices of the circuit modules.

The configuration according to the invention of a plurality of circuit modules is characterized in that an electrical connection of various connecting devices among one another is respectively formed by essentially direct mechanical and electrical contact between connecting elements of various connecting devices.

It is consequently a basic idea of the invention to achieve an electrical contact, and, consequently, an interconnection, of the circuit modules in the configuration of a plurality of circuit modules by the connecting elements of the circuit modules, each of which in themselves form a corresponding connecting device of the circuit module for external electrical bonding. The connecting elements are connected essentially directly to one another and without further bonding devices being interposed or used. If, consequently, circuit modules disposed one above the other have to be interconnected, such interconnection takes place according to the invention by configuring the connecting elements that form the connecting devices of the respective circuit modules such that they can enter essentially directly into contact with one another. The directness is not precluded by a soldering or welding flux being provided for the electrical bonding and fixing.

In principle, such a configuration according to the invention requires no additional components for the electrical bonding of the circuit modules disposed one above the other for establishing the contact between the individual connecting elements of the circuit modules. As a result, assembly is made more simple and reliable.

The configuration according to the invention of a plurality of circuit modules is made particularly advantageous if the connecting elements have the same form or have essentially the same effect with regard to their geometrical, mechanical and/or electrical properties. Specifically when essentially coinciding circuit modules are used, it is appropriate for all the connecting elements that form the connecting device of the respective circuit modules to be identically configured, which allows for a mass production process.

In accordance with another feature of the invention, the connecting elements are fixed on the connection carrier.

The connecting elements are preferably configured as a connecting wire, which is formed, in particular, with an essentially linear extent. With such a connecting element in the form of a connecting wire, all the distances, for example from a contact region on any face of the circuit module to its margin, can be bridged in a simple way. In addition, connecting wires have particularly favorable properties with regard to their dimensional stability and mechanical durability. They are simple to produce, can be easily shaped, and are, nevertheless, resistant enough to be used in an automatic assembly and component-insertion machine.

In accordance with a further feature of the invention, the connecting elements, in particular, the connecting wires, each have a first end for the electrical bonding to a respective circuit module. Furthermore, a second end is provided, which may serve if appropriate for the electrical bonding to at least one other connecting element of another circuit module. Furthermore, the connecting element, in particular, the connecting wire, has a main region, which extends between the first end and the second end of the connecting element and which covers, in particular, the distance between the regions to be bonded.

A particularly simple geometrical configuration provides that the second ends of the connecting elements, in particular, the connecting wires, each have a region extending essentially linearly and/or essentially perpendicularly in relation to the main region. Thus, in the case of the connecting elements, the main region and the second end for the electrical bonding to other connecting elements of other circuit modules are essentially perpendicular to each other. In such a case, it is of particular advantage that the connecting elements, in particular, the connecting wires, preferably have essentially the form of a hook, in particular, an elongated hook, an "L", a claw or the like. Furthermore, it is preferred in such case for a kind of shoulder or the like to be respectively formed in a transitional region between the main region of the connecting element and the first and/or second end of the connecting element.

Based upon the above measures, on one hand, a contact with the circuit module to be interconnected can be established and, on the other hand, an interconnection with vertically neighboring circuit modules can be realized in a particularly simple way. The connecting element, the shoulders, and, in particular, the second end region of the connecting elements are suitable for forming a contact with other connecting elements.

During the assembly of the configuration according to the invention of a plurality of circuit modules, permanent deformations, in particular, of the connecting elements or connecting devices, must be avoided. Because, however, during the positioning of the circuit modules provided with the connecting elements, a certain tolerance in the positioning and movement of the individual circuit modules in the vertical direction, but also in the horizontal direction, cannot be ruled out, it is of particular advantage that the connecting elements of the configuration according to the invention of a plurality of circuit modules, in particular, the connecting wires, are each flexibly resilient, in particular, in the region of the second ends. The resiliency allows the connecting elements to take up the tolerances during the positioning, and the resultant mechanical damage, without defects occurring in the connecting elements themselves or at the contact points.

A configuration according to the invention of a plurality of circuit modules is advantageously formed specifically by configuring each of the circuit modules in essentially the same form and/or to have essentially the same effect with regard to their geometrical, mechanical and/or electrical, especially electronic, properties.

Particularly space-saving configurations or stacks are obtained if a high packing density or stacking density can be achieved. Experience shows, however, that a prerequisite for a high stacking or packing density is a similarity in the geometrical and mechanical properties. In addition, it may indeed also be of advantage if the electrical properties, and, in particular, the circuit properties, are correspondingly made to match one another.

The circuit modules are preferably each configured such that they are essentially of a flat, laminar, or similar form and/or essentially planar, with an upper side and an underside in each case. Such configuration likewise permits a particularly high packing density, which can then be achieved in a simple way, in particular, within an automatic production process.

The circuit modules preferably have in each case at least one semiconductor chip, in particular, a memory device, and/or they are configured as such a device. The stacking of memory elements one above the other has the enormous advantage that the electronic similarity of essentially identical circuit modules can be utilized. Achievement of the highest possible utilization of the wiring surface area is also necessary and desirable in the case of memory devices. Such utilization can be achieved in a simple way based on the configuration according to the invention of a plurality of circuit modules.

For the electrical bonding of the circuit modules to their connecting devices, in particular, to the respective connecting elements, the circuit modules have in each case at least one contact region, which is provided, in particular, with a plurality of contacts for the external electrical bonding. In the case of semiconductor modules or chips, these contacts are generally realized by what are referred to as pads, which specifically realize the contact point of the internal semiconductor structure with the outside world. According to the invention, it is provided that the connecting elements of the connecting device of a circuit module, in particular, the first ends thereof, are electrically bonded in each case to the contacts of the contact region of the respective circuit module.

The contacts are preferably formed by metallic regions on the circuit modules, to be precise, preferably on their underside and, in particular, by pads, as they are known. In particular, in the case of memory chips, it has become established practice and is of advantage that the contact regions are in each case formed on an underside of the circuit module, in an essentially central region thereof in each case.

The industrial standard also refers to what are known as center pad chips (CPC).

In the construction of the connecting devices, certain forms of configurations have proven to be particularly advantageous. For instance, it is envisaged that the connecting device has least one series configuration of, in particular, equidistantly spaced-apart, parallel, and/or flush aligned and/or similarly oriented connecting elements, which are preferably aligned along at least one edge region of the respective circuit module. It is, thus, of particular advantage that, for example, connecting wires of the same form and length are disposed such that they are aligned parallel to one another and flush—in the manner of a comb.

It is preferred for the connecting device to have two series configurations of connecting elements and for the series configurations, in particular, the connecting elements thereof, to be disposed in each case such that they laterally coincide with one another or are staggered in relation to one another. The series configurations preferably lie essentially in a common plane and are disposed essentially mirror-symmetrically in relation to an axis lying in the plane.

The construction achieves the effect that the two series configurations of connecting elements are opposite each other such that the first ends respectively of the connecting elements of the series are facing one another and that the second ends—for the external electrical bonding—are in each case furthest away from one another. By such a staggered or coinciding configuration, allowance can be made for the respective configuration of the contacts on the underside of the circuit module.

The connecting elements or connecting wires form, for example, bonding legs, which in a coinciding configuration are aligned essentially in a co-linear manner. In such a case, each of the series configurations extends for example along one edge of the associated circuit module, with the result that two opposite edges remain free, while the two series configurations of connecting elements run at least partially along the two other opposite edges of the circuit module.

In another advantageous embodiment of the configuration according to the invention of a plurality of circuit modules, the connecting device has in each case four series configurations of connecting elements. These four series configurations are respectively disposed essentially along at least one edge region and lie in pairs opposite one another. The configuration achieves the effect, for example in the case of a circuit module with a square or rectangular base area, that a series of connecting elements extends in each case along an edge of the circuit module. Accordingly, a particularly high number of connecting devices can be formed.

It is also provided that the plurality of series configurations, in particular, the connecting elements thereof, lie essentially in a common plane. It is also provided that the series configurations lying respectively opposite one another, in particular, the connecting elements thereof, are aligned mirror-symmetrically in relation to an axis in the plane. The individual connecting elements of the opposite series configurations are then again aligned in a co-linear or coinciding manner or the connecting elements are staggered in relation to one another.

The series configurations can indeed be formed in each case by individual and separate connecting elements. However, the series configurations are advantageously formed in each case by an assembly of connecting elements that are disposed on a connection carrier and/or are fixed there. In such a configuration, an adhesive or adhesively bonding medium, in particular, a double-sided adhesive medium, may be formed as the connecting carrier, in particular, as a tape. The individual connecting elements are then able, in particular, to be applied and/or embedded there. Thus, a kind of double-sided adhesive tape or a corresponding embedding or adhesive bonding compound can be envisaged.

For the electrical bonding and interconnection of the circuit modules disposed one above the other, the series configurations of circuit modules provided directly one above the other have at least partially essentially vertically coinciding connecting elements. Consequently, the directly neighboring connecting elements of the circuit modules disposed directly one above the other can be brought into contact with one another in a particularly simple way to bring about an interconnection of the circuit modules.

It is of advantage that at least some of the vertically coinciding connecting elements of circuit modules provided directly one above the other are formed in such a way, in particular, with regard to their orientation, their geometrical dimensions, and/or the like, that they can be brought into mechanical and electrical contact with one another. In particular, a connecting element of a first circuit module that is disposed vertically higher in each case is to be electrically bonded by its second end in the region of a shoulder or of the second end of the respective vertically coinciding connecting element of the second circuit module disposed directly vertically thereunder.

The construction is realized in a particularly simple way, in particular, by forming the mechanical and electrical contact of the connecting elements by soldering, welding, in particular, laser welding, and/or based on a force closure with spring pretensioning in the region of the second ends of the connecting elements.

For better handling and for the electrical bonding and use of the configuration according to the invention of a plurality of circuit modules, a carrier is provided, on which is disposed, fixed, and/or electrically bonded the lowermost of the circuit modules. Advantageously a housing device is formed, in particular, in the form of a casting compound, in which at least the circuit modules can be accommodated. These measures ensure that the configuration of the plurality of circuit modules as a whole can be handled in a simple way. In such a case, the envisaged carrier may also have appropriate interconnection and electrical bonding, for example, for fitting into a higher-level device.

The configuration of circuit modules provided in the prior art has the disadvantage that compromises have to be made with regard to the circuit modules to be used, or else require a considerable expenditure for the connection of the circuit modules to one another.

In particular, by configuring what are referred to as center pad chips one above the other, in particular, in a chip scale package, these disadvantages cannot be accepted. With the configuration according to the invention of a plurality of circuit modules, these disadvantages are avoided by a fundamental connection concept applying universally to all the circuit modules disposed one above the other. The construction according to the invention makes it possible in a simple way for the electrical connections to be led out to the margin of the circuit configuration and around the circuit configuration by the respective connecting devices or connecting elements. It is, consequently, possible to produce standard individual components, that is the circuit modules, which allow themselves to be mounted and disposed one above the other, and such placement takes place in a way that is particularly simple and suitable for automation. The electrical connection is achieved in each case by the overlapping and permanent connection of the connecting elements or connecting wires (interconnector leads). The connecting wires or connecting elements may either be applied individually or else be made in the form of a structured flex tape.

It is also possible to mount more than two circuit modules or chips one above the other. In addition, there is, in principle, the possibility, in a simple way, of removing defective components from the stack of circuit modules that are disposed one above the other and are interconnected.

In accordance with an added feature of the invention, there are provided spacing elements, with respective spacing elements provided between every adjacent pair of the circuit modules.

In accordance with a concomitant feature of the invention, the spacing elements remove heat from the circuit modules, preferably, the spacing elements are heat sinks.

Other features that are considered as characteristic for the invention are set forth in the appended claims.

Although the invention is illustrated and described herein as embodied in a configuration of a plurality of circuit modules, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

FIG. 2 is a fragmentary, diagrammatic, bottom plan view of the circuit module of FIG. 1;

FIG. 3 fragmentary, diagrammatic, bottom plan view of an alternative embodiment of the circuit module of FIG. 1;

DESCRIPTION OF THE PREFERRED EMBODIMENTS

Figure 1:
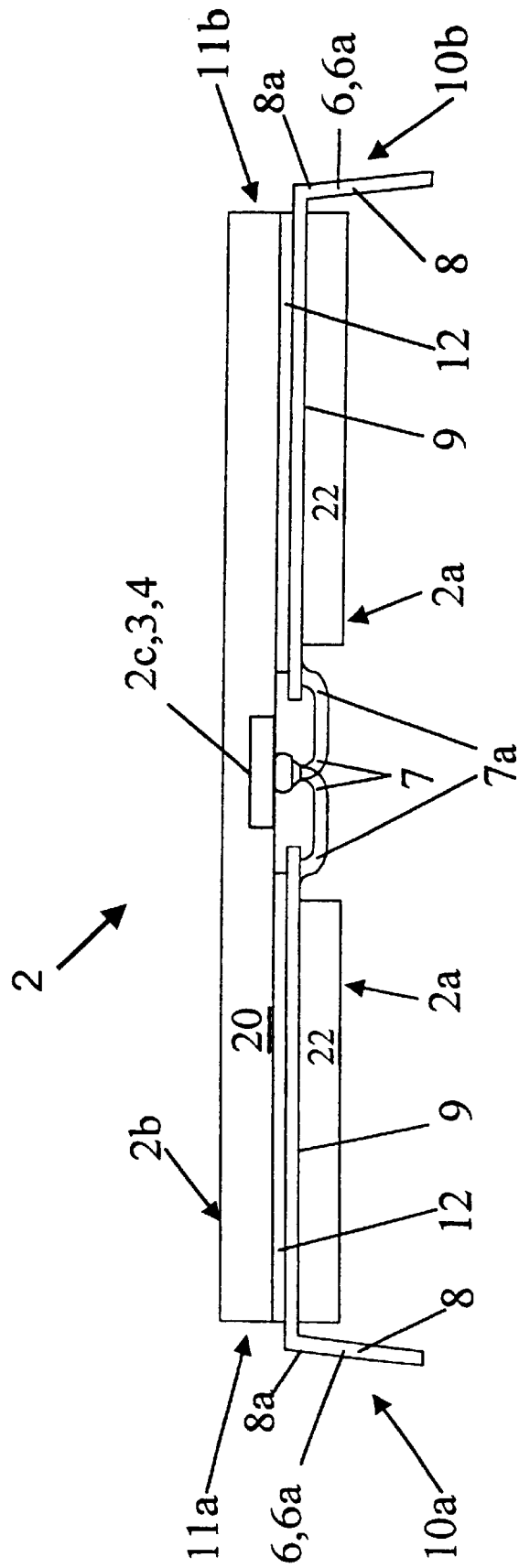
FIG. 1 is a cross-sectional view of one circuit module for use in a plurality of circuit modules according to the invention.

In all the figures of the drawing, sub-features and integral parts that correspond to one another bear the same reference symbol in each case.

Referring now to the figures of the drawings in detail and first, particularly to FIG. 1 thereof, there is shown, in a schematic and partly sectional side view, a circuit module 2, as it is used in an exemplary embodiment of the configuration according to the invention of a plurality of circuit modules 2.

The circuit module 2 essentially includes a chip 20, which may, for example, also be cast into a corresponding substrate. The circuit module 2 has essentially a flat, plate-like and cuboidal shape and has edge or side regions 11a and 11b. While the upper side 2b of the circuit module 2 remains free, the connecting device 5 for external electrical bonding is formed on the underside 2a of the circuit module. See FIG. 2.

The connecting device 5 includes two series configurations 10a and 10b of connecting elements 6 formed on a respective connection carrier 12.

The connecting elements 6 respectively have a main region 9, a first end region 7 and a second end region 8. The end regions 7 are formed, respectively, for being connected to a contact region 3 of the circuit module 2 and there, in particular, to contacts 4. On the other hand, the second ends 8 of the connecting elements 6 are intended for electrical bonding to other connecting elements 6 of other circuit modules 2. For such a purpose, the connecting elements 6 respectively have a shoulder 8a in the transitional region between the main region 9 and the second end 8. A shoulder region 7a is also respectively provided in the transitional region between the main region 9 and the first end of the connecting element 6.

For the suitable spacing apart of the circuit modules 2 to be disposed one above the other, what is known as a spacing element 22 is respectively formed on the underside 2a of the circuit module 2.

In FIG. 2, the underside 2a of the circuit module 2 shown in FIG. 1 is represented, with the spacing elements 22 omitted.

Formed in a central region 2c of the underside 2a of the circuit module 2 is the contact region 3, which has a plurality of contacts 4. Extending from the contacts 4 are connecting elements 6 in the form of connecting wires 6a, the connecting wires 6a being electrically bonded by their first ends 7 to the contacts 4. The wires 6a then extend from the central region 2c on the underside 2a linearly toward the edge regions 11a and 11b, where they run out into their second ends 8, which extend perpendicularly upward out of the plane of the drawing.

The connecting elements 6 or the connecting wires 6a of the connecting devices 5 that belong to the edge regions 11a and 11b of the circuit module 2 are respectively constructed as series configurations 10a, 10b, disposed in a staggered and flush manner. The connecting wires 6a run alternately outward to the right or outward to the left to the edge region 11b or 11a of the circuit module 2.

FIG. 3 illustrates that the connecting elements 6 or 6a of the series configurations 10a and 10b may also be aligned in a coinciding manner, where two adjacent series of contacts 4 are provided in the central region 2c of the underside 2a of the circuit module 2, in the contact region 3 of the circuit module 2.

Otherwise, the construction shown in FIG. 3 is identical to the construction shown in FIG. 2.

Figure 4:
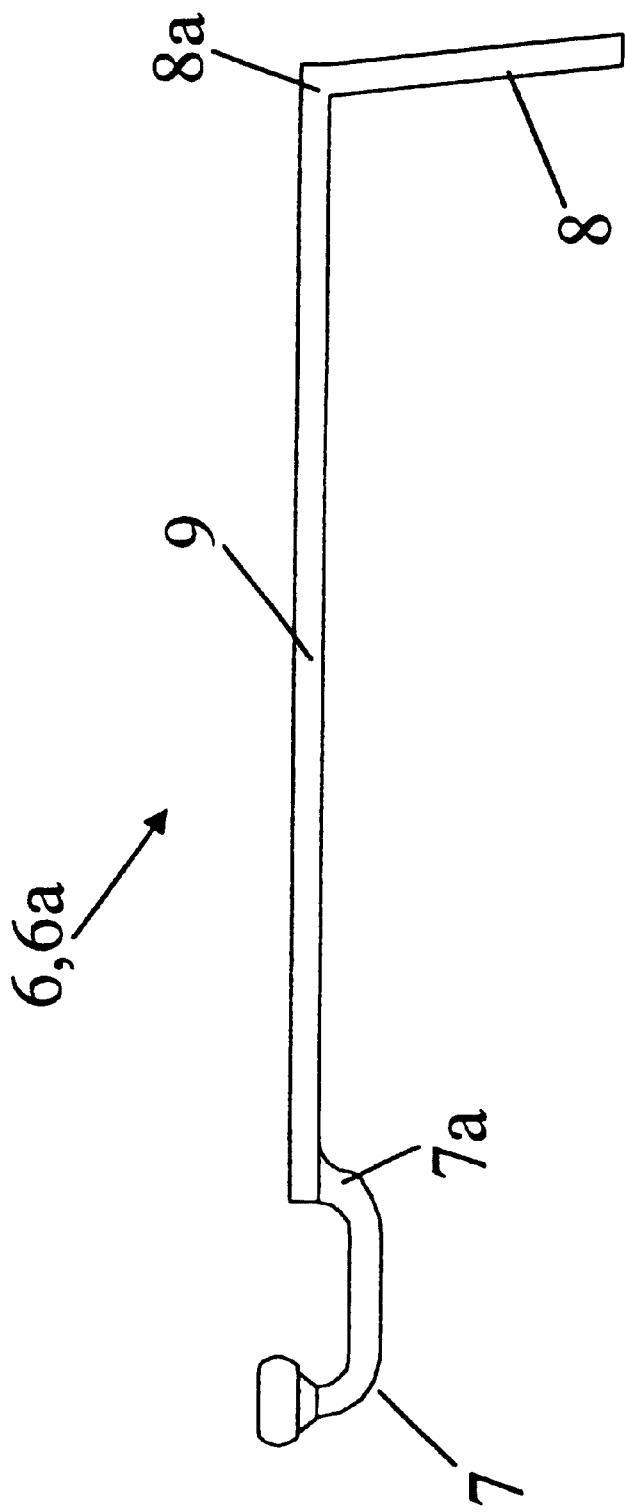
FIG. 4 is a diagrammatic side view of a connecting element for use in an exemplary embodiment of the plurality of circuit modules according to the invention.

FIG. 4 schematically illustrates a partly sectional side view of a connecting element 6 or a connecting wire 6a as it is used in the circuit module 2 shown in FIG. 1 for the external electrical bonding of circuit modules 2 to one another.

A linearly extending main region 9 essentially forms the connecting wire 6a or the connecting element 6. The connecting wire 6a has a first end 7, which leaves the main region 9 of the connecting wire 6a from a first shoulder region 7a. Formed opposite the first end 7 is a second end 8, which leaves the main region 9 of the connecting wire 6a from a second shoulder region 8a. The second end 8a is formed by an essentially linear wire portion, which is essentially formed perpendicularly in relation to the main region 9 of the connecting wire 6a. Seen altogether, the connecting wire 6a has, in the exemplary embodiment, essentially the form of an elongated hook, a claw, or an "L".

Figure 5:
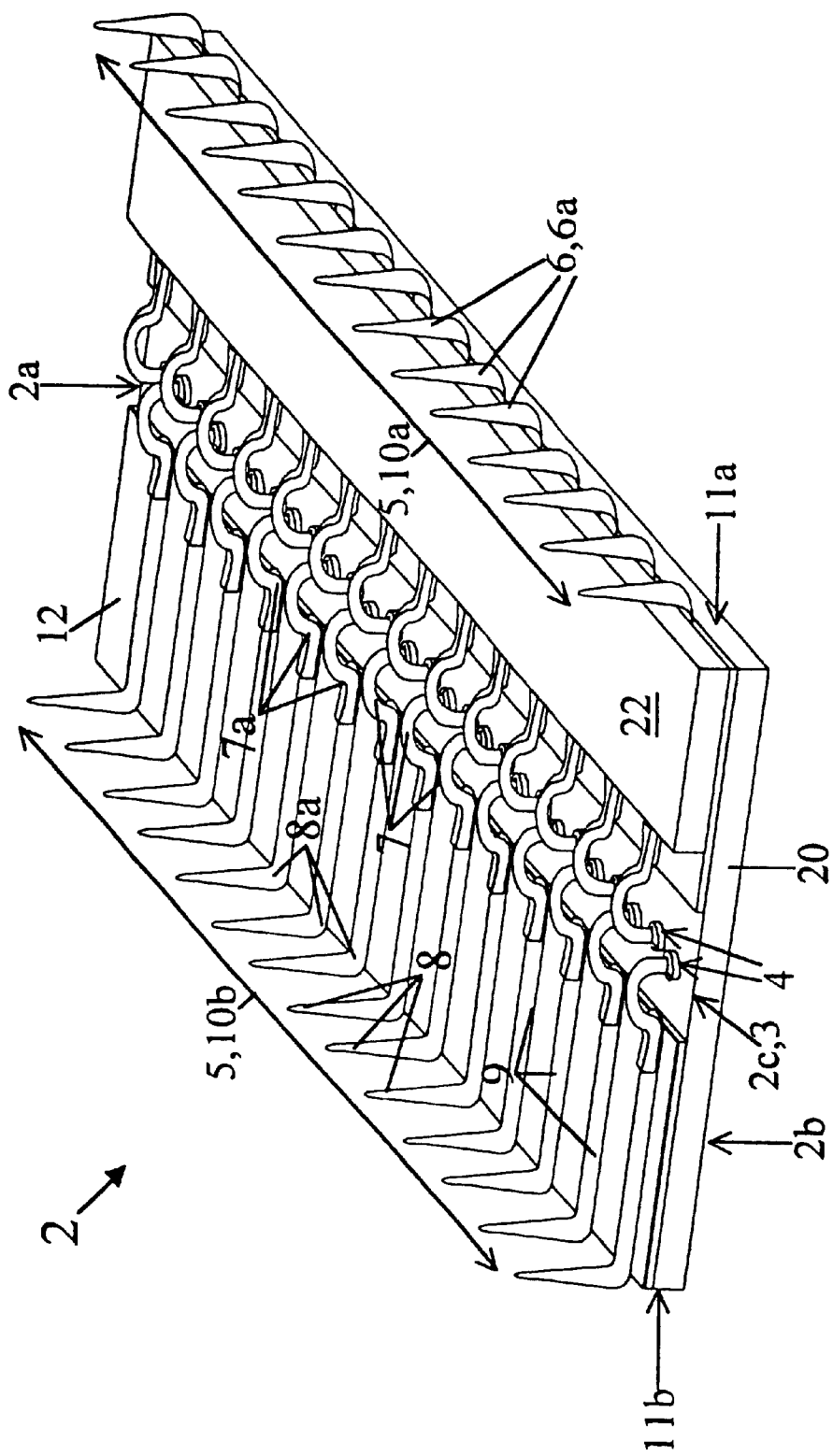
FIG. 5 is a perspective view of an underside of the circuit module of FIG. 1.

For better illustration of the circuit module 2 to be used in the configuration according to the invention, the circuit module 2 from FIG. 1 is represented in FIG. 5 in a perspective view from below, with one of the spacing elements 22 having been omitted for clarity.

The circuit module 2, in turn, includes a circuit configuration 20, which, if appropriate, is accommodated in a corresponding casting compound. The upper side of the circuit configuration 20, consequently, also forms the upper side 2b of the circuit module 2. The underside 2a of the circuit module 2 is essentially formed by the connecting device 5, which has two series configurations 10a, 10b of connecting elements 6 or connecting wires 6a.

The connecting elements 6 or connecting wires 6a have, in turn, the form of an elongated hook or a claw or an "L", a linearly extending main region 9 with a first end 7 and a second end 8.

The plurality of connecting elements 6 or connecting wires 6a of the two series configurations 10a, 10b are staggered, offset with respect to one another, and run with their first ends 7 in the region of the contacts 4 of the contact region 3 in the central region 2c of the underside 2a of the circuit module 2 perpendicularly toward the marginal regions 11a, 11b of the circuit module 2. The second ends 8 of the connecting elements 6 or the connecting wires 6a are then essentially formed at the marginal regions 11a and 11b of the circuit module 2. The second ends 8, which are essentially disposed perpendicularly on the main regions 9 of the connecting wires 6a, are aligned such that they point away from the circuit configuration 20 and the upper side or surface 2b of the circuit module 2.

For the appropriate spacing apart of the circuit modules 2 to be disposed one above the other, a spacing element 22 is provided respectively, covering the series configuration 10a or 10b from the underside. The series configurations 10a, 10b are disposed respectively on a connection carrier 12, for example, in the form of a flex tape, and are attached there.

Figure 6:
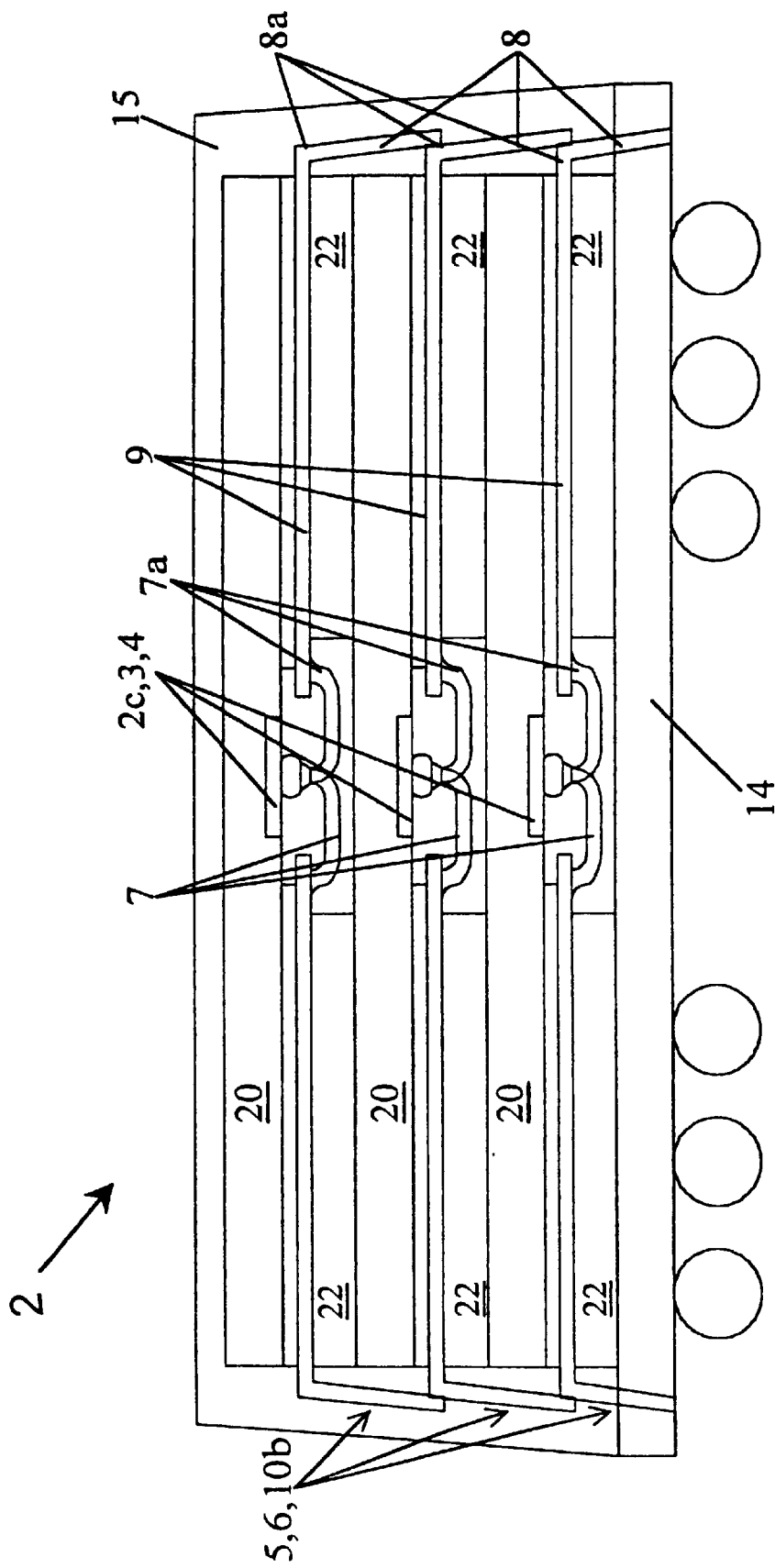
FIG. 6 is a cross-sectional view of exemplary embodiment of a configuration of a plurality of circuit modules according to the invention.

FIG. 6 shows a schematic and partly sectional side view of an exemplary embodiment of the configuration according to the invention of a plurality of circuit modules.

In the embodiment of FIG. 6, three circuit modules 2 of identical geometrical construction are disposed one above the other on a carrier 14. The circuit modules 2 are separated from one another and from the carrier 14 by correspondingly provided spacing elements 22.

Each of the circuit modules 2 has a circuit configuration 20, which may be embedded in a corresponding casting compound. The upper side 2b of a circuit module 2 that is disposed lower in the vertical alignment is respectively in contact with the underside 2a of the circuit module 2 following upward in the vertical direction. The lowermost circuit module 2 rests with its underside 2a or the corresponding spacing elements 22 on the upper side of the carrier 14 and is electrically bonded there. The upper side 2b of the uppermost circuit module 2 remains free or is in direct contact with the housing material of the housing device 15.

The spacing elements 22 may serve additionally for removing heat from the circuit modules 2 stacked one above the other. For heat removal purposes, they are then formed from a material enhancing heat transport and, to increase the size of their surface area, preferably extend beyond the edge regions, which are not occupied by contact elements.

As can be seen from FIG. 5, the connecting elements 6 or connecting wires 6a of a circuit module 2 disposed at the top in the vertical direction are in mechanical and electrical contact by their second ends 8 with the connecting devices 6 or connecting wires 6a of the circuit module 2 respectively disposed directly thereunder in the vertical direction, to be precise, in particular, in what are referred to as the shoulder regions 8a of the connecting elements 6 or connecting wires 6a. The connecting wires 6a or connecting elements 6 of the circuit module 2 disposed at the very bottom are then attached and electrically bonded directly on the carrier 14 and, consequently, realize the external connection, for example, in a higher-level circuit device or application.

I claim:

1. A circuit configuration, comprising:
   circuit modules disposed substantially one above another approximately in a stack, each of said circuit modules having a connection carrier and a connecting device for externally and electrically bonding said circuit modules;
   said connecting device having at least one series configuration of connecting elements, said connecting elements each having a surface, said surfaces disposed substantially in a plane;
   said connecting elements disposed and fixed on said connection carrier;
   said connecting device of at least one of said circuit modules at least partially electrically connected to another connecting device of at least one different one of said circuit modules in direct mechanical and electrical contact;
   said connection carrier being at least one of an adhesive, an adhesive bonding medium, a double-sided adhesive medium, and a tape; and
   said connecting elements being at least one of applied and embedded at said connection carrier.

2. The configuration according to claim 1, wherein said connecting elements have a substantially identical form.

3. The configuration according to claim 1, wherein said connecting elements have substantially identical properties selected from the group consisting of geometrical properties, mechanical properties, and electrical properties.

4. The configuration according to claim 1, wherein said connecting elements are connecting wires.

5. The configuration according to claim 4, wherein said connecting wires extend substantially linearly.

6. The configuration according to claim 4, wherein each of said connecting wires has:
   a first end for electrically bonding one of said connecting wires to a respective one of said circuit modules;
   a second end for electrically bonding one of said connecting wires to at least one of said connecting elements of another of said circuit modules; and
   a main region extending between said first end and said second end.

7. The configuration according to claim 6, wherein:
   each of said connecting elements has a shoulder; and at least one of said vertically coinciding connecting elements of said circuit modules provided directly one above another have geometrical dimensions to permit mechanical and electrical contact with one another whereby one connecting element of a first of said circuit modules disposed vertically higher is electrically bonded by one of:
      a second end of said one connecting element in a region of said shoulder; and
      in a region of said second end,
   of a respectively vertically coinciding connecting element of a second of said circuit modules disposed directly vertically under said first of said circuit modules.

8. The configuration according to claim 6, wherein said second end has a region extending at least one of substantially linearly and substantially perpendicularly with respect to said main region.

9. The configuration according to claim 6, wherein:
   each of said connecting wires has one of the group consisting of a hook shape, an elongated hook shape, an L-shape, a claw shape; and
   each of said connecting wires has a shoulder at a transition between said main region and at least one of said first end and said second end.

10. The configuration according to claim 9, wherein each of said circuit modules has at least one contact region with contacts for externally electrically bonding a respective one of said circuit modules, and said first end of said connecting elements is respectively electrically bonded to at least one of said contacts.

11. The configuration according to claim 6, wherein each of said connecting wires is flexibly resilient.

12. The configuration according to claim 11, wherein each of said connecting wires is flexibly resilient in a vicinity of said second end.

13. The configuration according to claim 6, wherein said mechanical and electrical contact of said connecting device is made by at least one of the group consisting of soldering, welding, laser welding, and a force closure by spring pretensioning in a region of said second end.

14. The configuration according to claim 1, wherein said circuit modules are substantially flat, and each of said circuit modules has an upper side and an underside.

15. The configuration according to claim 1, wherein said circuit modules are substantially laminar, and each of said circuit modules has an upper side and an underside.

16. The configuration according to claim 1, wherein said circuit modules are substantially planar, and each of said circuit modules has an upper side and an underside.

17. The configuration according to claim 1, wherein each of said circuit modules has at least one semiconductor chip.

18. The configuration according to claim 1, wherein each of said circuit modules has at least one memory device.

19. The configuration according to claim 1, wherein each of said circuit modules is a semiconductor memory device.

20. The configuration according to claim 1, wherein each of said circuit modules has at least one contact region with contacts for externally electrically bonding a respective one of said circuit modules, and each of said connecting elements is respectively electrically bonded to at least one of said contacts.

21. The configuration according to claim 20, wherein said contacts are metallic regions on said circuit modules.

22. The configuration according to claim 21, wherein said contacts are metallic pads.

23. The configuration according to claim 20, wherein:
   each of said circuit modules has a central region and an underside; and
   said at least one contact region is disposed on said underside substantially in said central region.

24. The configuration according to claim 1, wherein said circuit modules have a substantially identical form.

25. The configuration according to claim 1, wherein said connecting elements are aligned.

26. The configuration according to claim 25, wherein said connecting elements are at least one of equidistantly spaced apart, parallel, flush, and similarly oriented.

27. The configuration according to claim 25, wherein:
   each of said circuit modules has at least one edge region; and
   said connecting elements of each respective one of said circuit modules are aligned along said at least one edge region.

28. The configuration according to claim 25, wherein:
   each of said circuit modules has at least one edge region; and
   said connecting elements of each respective one of said circuit modules are aligned and at least one of equidistantly spaced apart, parallel, flush, and similarly oriented along said at least one edge region.

29. The configuration according to claim 25, wherein:
   said connecting device has two series configurations of connecting elements;
   said connecting elements of each of said series configurations laterally coincide with one another; and
   said two series configurations substantially lie in a common plane having an axis and are disposed substantially mirror-symmetrical with respect to said axis.

30. The configuration according to claim 29, wherein each of said series configurations are made of individual, separate ones of said connecting elements.

31. The configuration according to claim 30, wherein:
   said connection carrier is at least one of an adhesive, an adhesive bonding medium, a double-sided adhesive medium, and a tape; and
   said connecting elements are to be at least one of applied and embedded at said connection carrier.

32. The configuration according to claim 29, wherein each of said series configurations are made of an assembly of connecting elements.

33. The configuration according to claim 29, wherein said series configurations of said circuit modules provided directly one above another have at least partially essentially vertically coinciding connecting elements.

34. The configuration according to claim 25, wherein:
   said connecting device has two series configurations of connecting elements;
   said connecting elements of each of said series configurations are staggered with respect to one another; and
   said two series configurations substantially lie in a common plane having an axis and are disposed substantially mirror-symmetrical with respect to said axis.

35. The configuration according to claim 25, wherein:

each of said circuit modules has at least two edge regions;

said connecting device has four series configurations of connecting elements;

said connecting elements of each of said series configurations are disposed substantially along a respective one of said two edge regions in pairs opposite one another;

said series configurations substantially lie in a common plane having an axis and two of said pairs of opposite series configurations are disposed substantially mirror-symmetrical with respect to said axis.

36. The configuration according to claim 35, wherein said series configurations of said circuit modules provided directly one above another have at least partially essentially vertically coinciding connecting elements.

37. The configuration according to claim 1, wherein said mechanical and electrical contact of said connecting device is made by at least one of the group consisting of soldering, welding, laser welding, and a force closure by spring pre-tensioning.

38. The configuration according to claim 1, including a carrier, a lowermost one of said circuit modules being disposed at said carrier.

39. The configuration according to claim 38, wherein a lowermost one of said circuit modules is fixed to said carrier.

40. The configuration according to claim 38, wherein a lowermost one of said circuit modules is electrically bonded to said carrier.

41. The configuration according to claim 1, including a housing device for accommodating said circuit modules.

42. The configuration according to claim 41, wherein said housing device is a casting compound.

43. The configuration according to claim 1, including spacing elements, a respective one of said spacing elements provided between every adjacent pair of said circuit modules.

44. The configuration according to claim 43, wherein said spacing elements remove heat from said circuit modules.

45. The configuration according to claim 43, wherein said spacing elements are heat sinks.

46. The configuration according to claim 1, wherein said circuit modules have substantially identical properties selected from the group consisting of geometrical properties, mechanical properties, electrical properties, and electronic properties.

* * * * *